United States Patent
Sharangpani et al.

(10) Patent No.: US 9,379,124 B2
(45) Date of Patent: Jun. 28, 2016

(54) VERTICAL FLOATING GATE NAND WITH SELECTIVELY DEPOSITED ALD METAL FILMS

(71) Applicant: SanDisk Technologies Inc., Plano, TX (US)

(72) Inventors: Rahul Sharangpani, Fremont, CA (US); Raghuveer S. Makala, Sunnyvale, CA (US); Thomas Jongwan Kwon, Dublin, CA (US); Senaka Kanakamedala, Milpitas, CA (US); George Matamis, Danville, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/314,370

(22) Filed: Jun. 25, 2014

(65) Prior Publication Data

US 2015/0380422 A1    Dec. 31, 2015

(51) Int. Cl.
| | |
|---|---|
| *G11C 11/34* | (2006.01) |
| *H01L 27/115* | (2006.01) |
| *H01L 29/423* | (2006.01) |
| *G11C 16/04* | (2006.01) |
| *G11C 16/06* | (2006.01) |
| *H01L 29/788* | (2006.01) |
| *H01L 21/28* | (2006.01) |
| *H01L 21/285* | (2006.01) |

(Continued)

(52) U.S. Cl.
CPC ...... *H01L 27/11556* (2013.01); *G11C 16/0408* (2013.01); *G11C 16/06* (2013.01); *H01L 21/0217* (2013.01); *H01L 21/02164* (2013.01); *H01L 21/28273* (2013.01); *H01L 21/28556* (2013.01); *H01L 21/28568* (2013.01); *H01L 21/31111* (2013.01); *H01L 21/32055* (2013.01); *H01L 27/11519* (2013.01); *H01L 29/42332* (2013.01); *H01L 29/7883* (2013.01)

(58) Field of Classification Search
CPC ................... H01L 27/11556; H01L 29/42332; G11C 16/0408; G11C 16/06; G11C 16/408
USPC ........................................ 365/185.17, 185.05
See application file for complete search history.

(56) References Cited

U.S. PATENT DOCUMENTS

| | | |
|---|---|---|
| 5,084,417 A | 1/1992 | Joshi et al. |
| 5,807,788 A | 9/1998 | Brodsky et al. |

(Continued)

FOREIGN PATENT DOCUMENTS

WO    WO02/15277 A2    2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — Viet Q Nguyen
(74) *Attorney, Agent, or Firm* — The Marbury Law Group PLLC

(57) ABSTRACT

A method of making a monolithic three dimensional NAND string which contains a semiconductor channel and a plurality of control gate electrodes, includes selectively forming a plurality of discrete charge storage regions using atomic layer deposition. The plurality of discrete charge storage regions includes at least one of a metal or an electrically conductive metal oxide.

19 Claims, 14 Drawing Sheets

(51) Int. Cl.
*H01L 21/311* (2006.01)
*H01L 21/3205* (2006.01)
*H01L 21/02* (2006.01)

(56) References Cited

U.S. PATENT DOCUMENTS

| | | | |
|---|---|---|---|
| 5,915,167 | A | 6/1999 | Leedy |
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,691,442 | B2 | 4/2010 | Gandikota et al. |
| 7,745,265 | B2 | 6/2010 | Mokhlesi et al. |
| 7,745,312 | B2 | 6/2010 | Herner et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi et al. |
| 8,053,829 | B2 | 11/2011 | Kang et al. |
| 8,187,936 | B2 | 5/2012 | Alsmeier et al. |
| 8,193,054 | B2 | 6/2012 | Alsmeier |
| 8,198,672 | B2 | 6/2012 | Alsmeier |
| 8,283,228 | B2 | 10/2012 | Alsmeier |
| 8,349,681 | B2 | 1/2013 | Alsmeier et al. |
| 8,445,347 | B2 * | 5/2013 | Alsmeier ............. H01L 21/764 257/316 |
| 8,765,543 | B2 * | 7/2014 | Alsmeier .......... H01L 27/11551 438/216 |
| 8,987,089 | B1 * | 3/2015 | Pachamuthu ..... H01L 27/11551 438/268 |
| 9,023,719 | B2 * | 5/2015 | Pachamuthu ..... H01L 21/28282 257/316 |
| 9,159,739 | B2 * | 10/2015 | Makala ............. H01L 27/11551 |
| 9,165,940 | B2 * | 10/2015 | Chien ............... H01L 29/66825 |
| 2007/0210338 | A1 | 9/2007 | Orlowski |
| 2007/0252201 | A1 | 11/2007 | Kito et al. |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 | 8/2010 | Fukuzumi et al. |
| 2010/0320528 | A1 | 12/2010 | Jeong et al. |
| 2011/0076819 | A1 | 3/2011 | Kim et al. |
| 2011/0133606 | A1 | 6/2011 | Yoshida et al. |
| 2011/0266606 | A1 | 11/2011 | Park et al. |
| 2012/0001247 | A1 | 1/2012 | Alsmeier |
| 2012/0001249 | A1 * | 1/2012 | Alsmeier .......... H01L 27/11551 257/319 |
| 2012/0256247 | A1 | 10/2012 | Alsmeier |
| 2013/0095646 | A1 * | 4/2013 | Alsmeier .......... H01L 27/11551 438/594 |
| 2013/0248974 | A1 | 9/2013 | Alsmeier et al. |
| 2013/0264631 | A1 | 10/2013 | Alsmeier et al. |
| 2013/0313627 | A1 | 11/2013 | Lee et al. |
| 2014/0008714 | A1 | 1/2014 | Makala et al. |
| 2014/0045307 | A1 * | 2/2014 | Alsmeier .......... H01L 27/11551 438/264 |
| 2015/0076586 | A1 * | 3/2015 | Rabkin ............. G11C 16/0483 257/324 |
| 2015/0294978 | A1 * | 10/2015 | Lu .................. H01L 27/1157 438/269 |
| 2015/0318297 | A1 * | 11/2015 | Hada .............. H01L 27/11582 438/269 |
| 2015/0318300 | A1 * | 11/2015 | Ohsaki ........... H01L 27/11582 438/258 |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.

Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).

Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.

U.S. Appl. No. 13/762,988, filed Feb. 8, 2013, SanDisk Technologies Inc.

U.S. Appl. No. 14/133,979, filed Dec. 19, 2013, SanDisk Technologies Inc.

U.S. Appl. No. 14/183,152, filed Feb. 18, 2014, SanDisk Technologies Inc.

U.S. Appl. No. 14/219,161, filed Mar. 19, 2014, SanDisk Technologies Inc.

U.S. Appl. No. 14/225,116, filed Mar. 25, 2014, SanDisk Technologies Inc.

U.S. Appl. No. 14/225,176, filed Mar. 25, 2014, SanDisk Technologies Inc.

U.S. Appl. No. 14/264,262, filed Apr. 29, 2014, SanDisk Technologies Inc.

U.S. Appl. No. 14/264,312, filed Apr. 29, 2014, SanDisk Technologies Inc.

U.S. Appl. No. 14/264,407, filed Apr. 29, 2014, SanDisk Technologies Inc.

U.S. Appl. No. 14/282,567, filed May 20, 2014, SanDisk Technologies Inc.

* cited by examiner

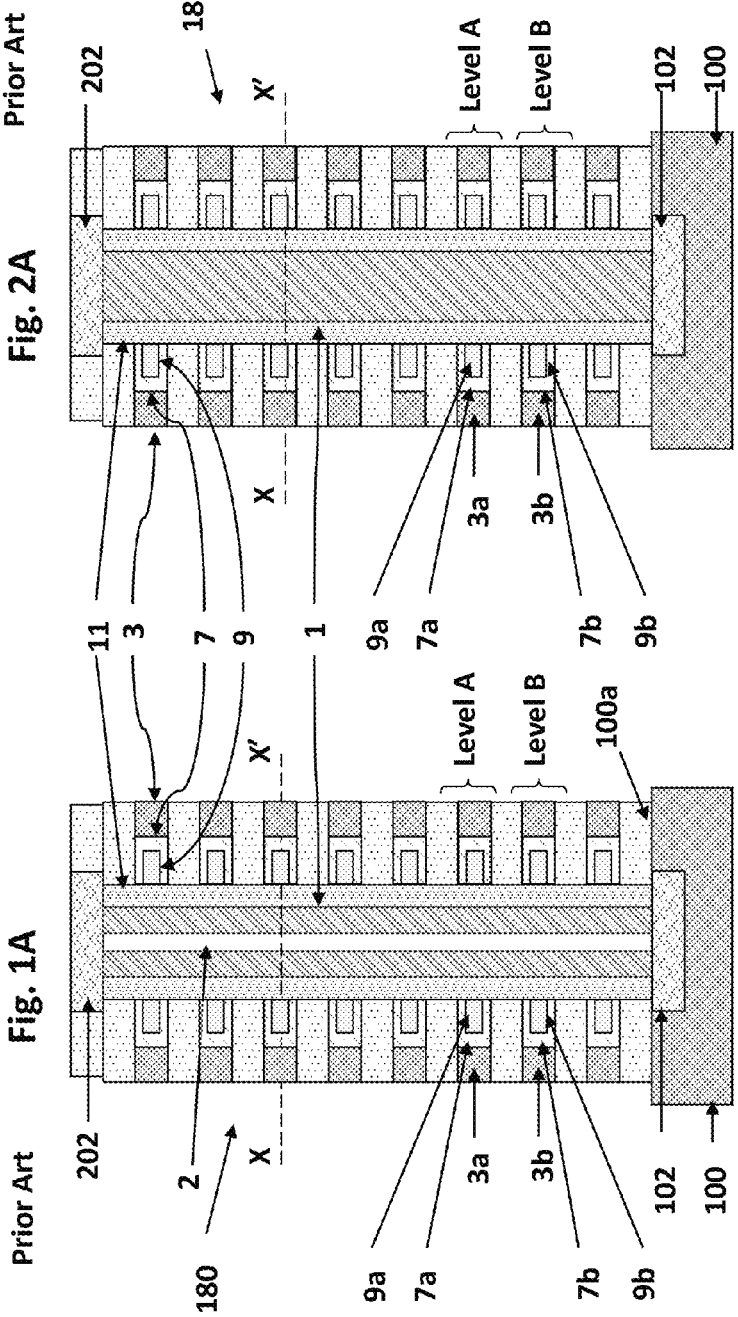

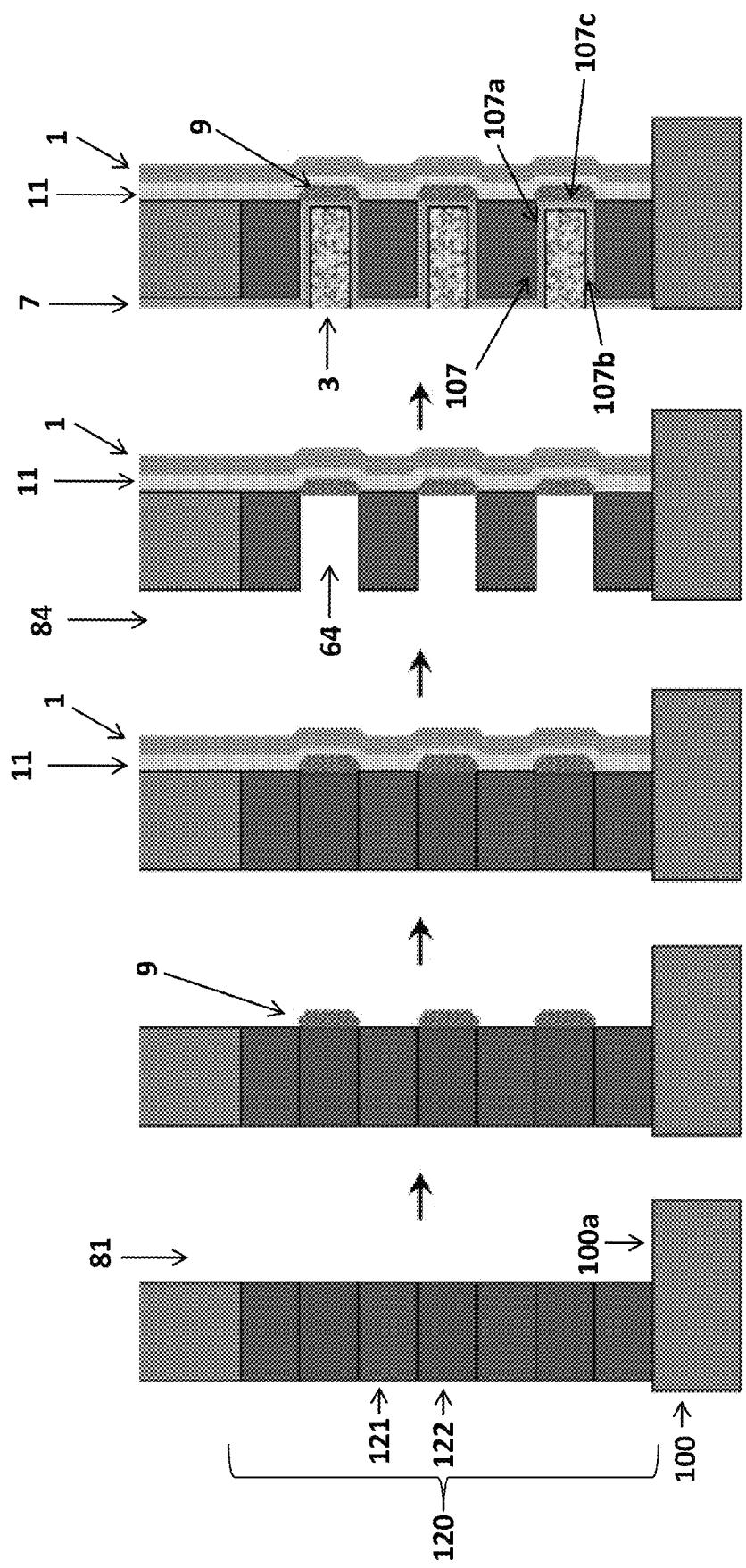

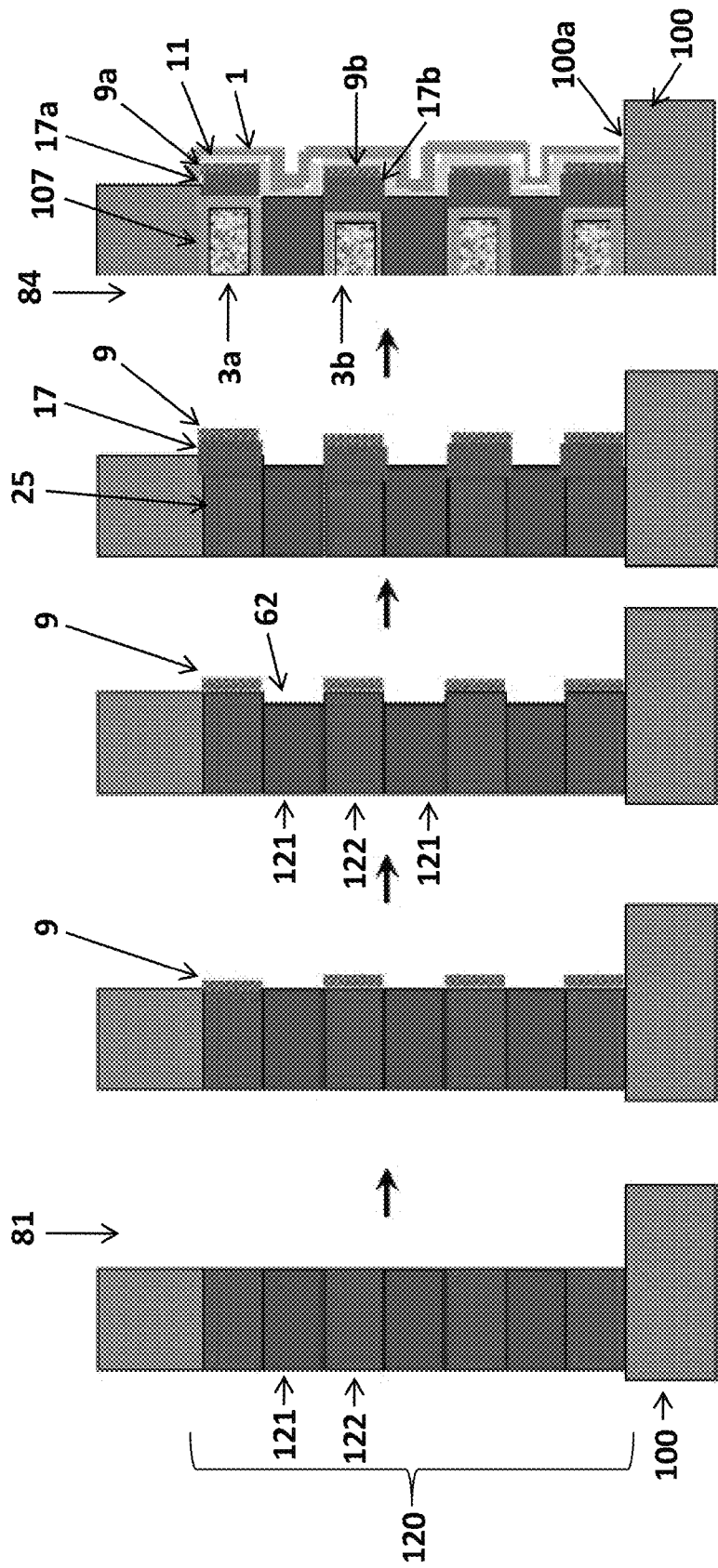

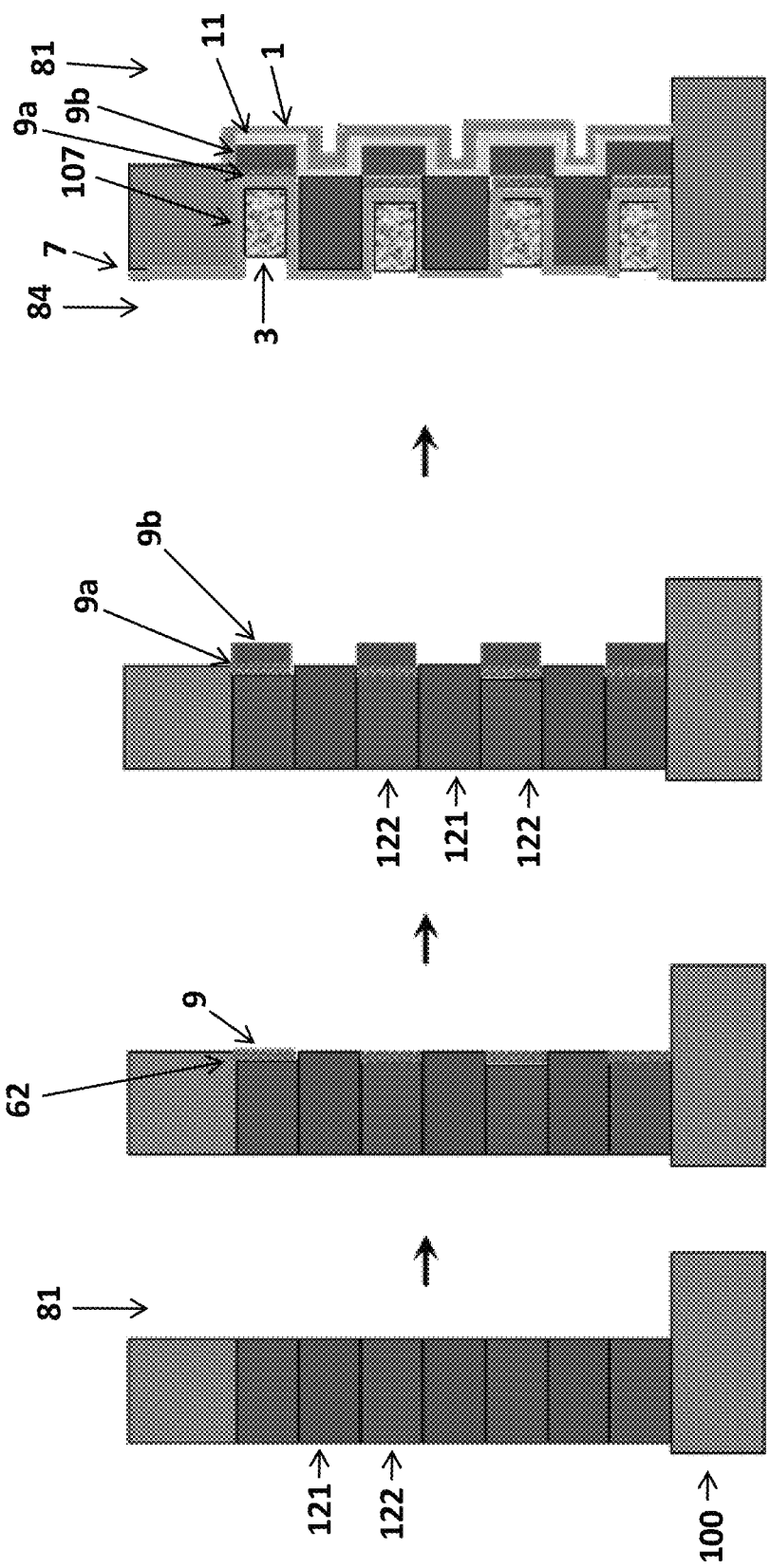

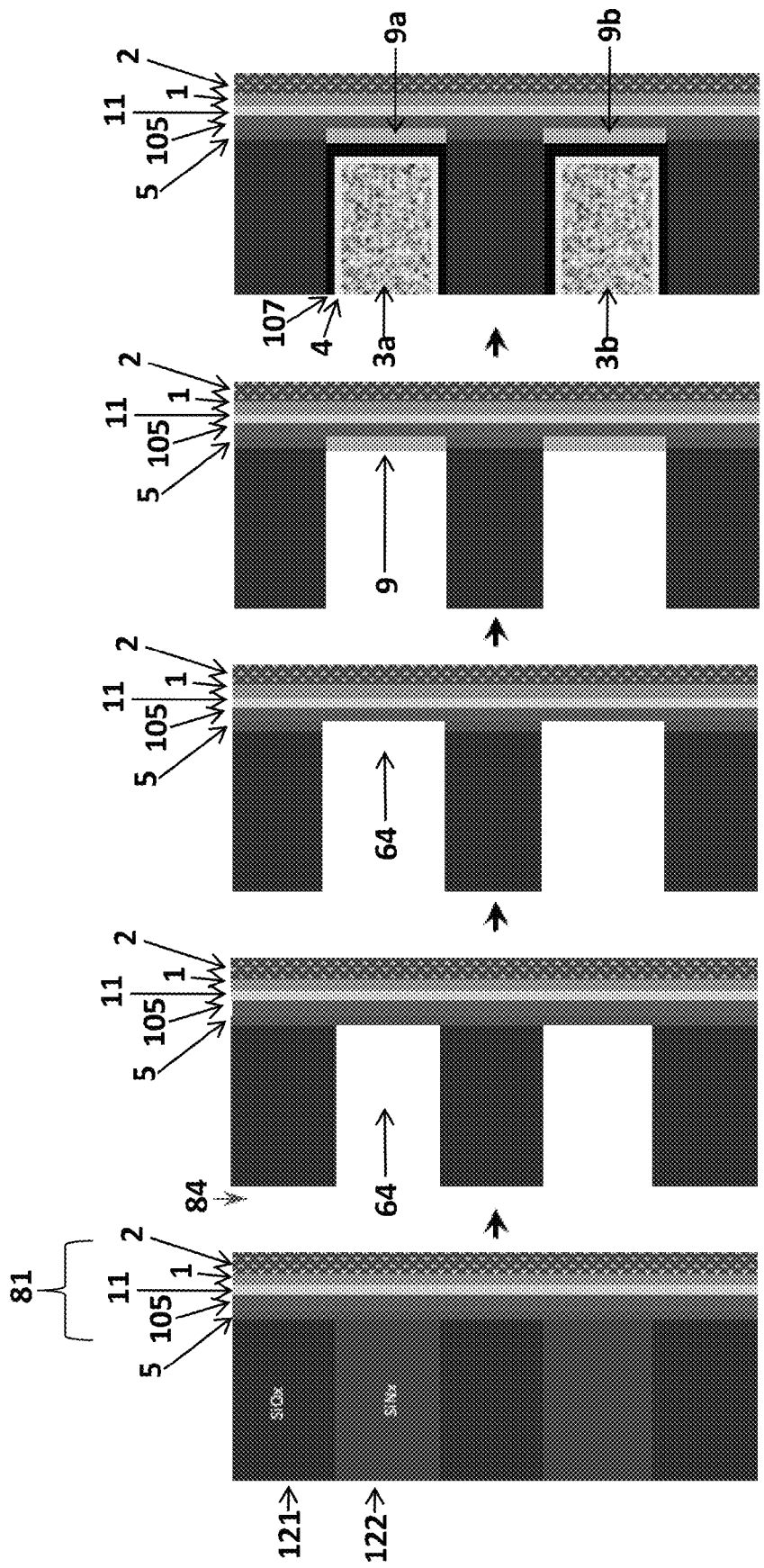

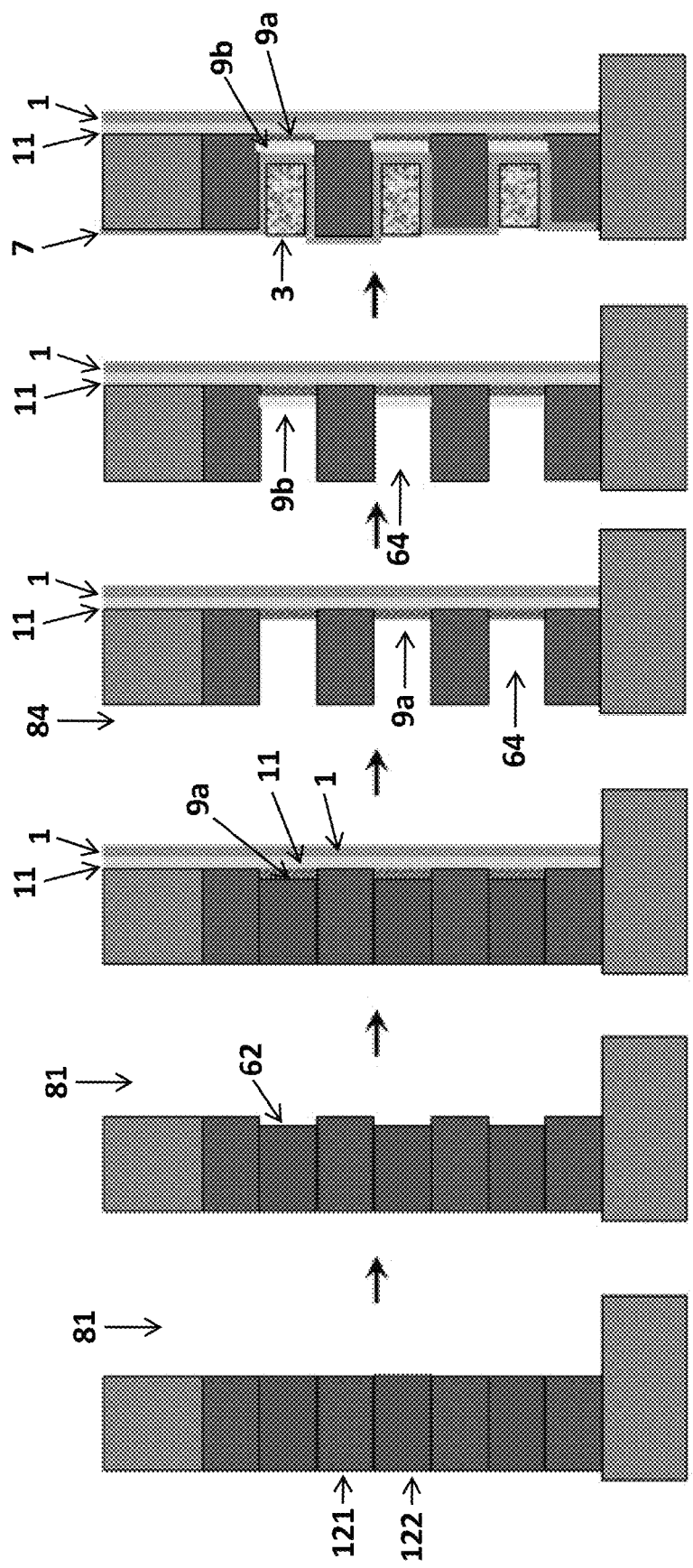

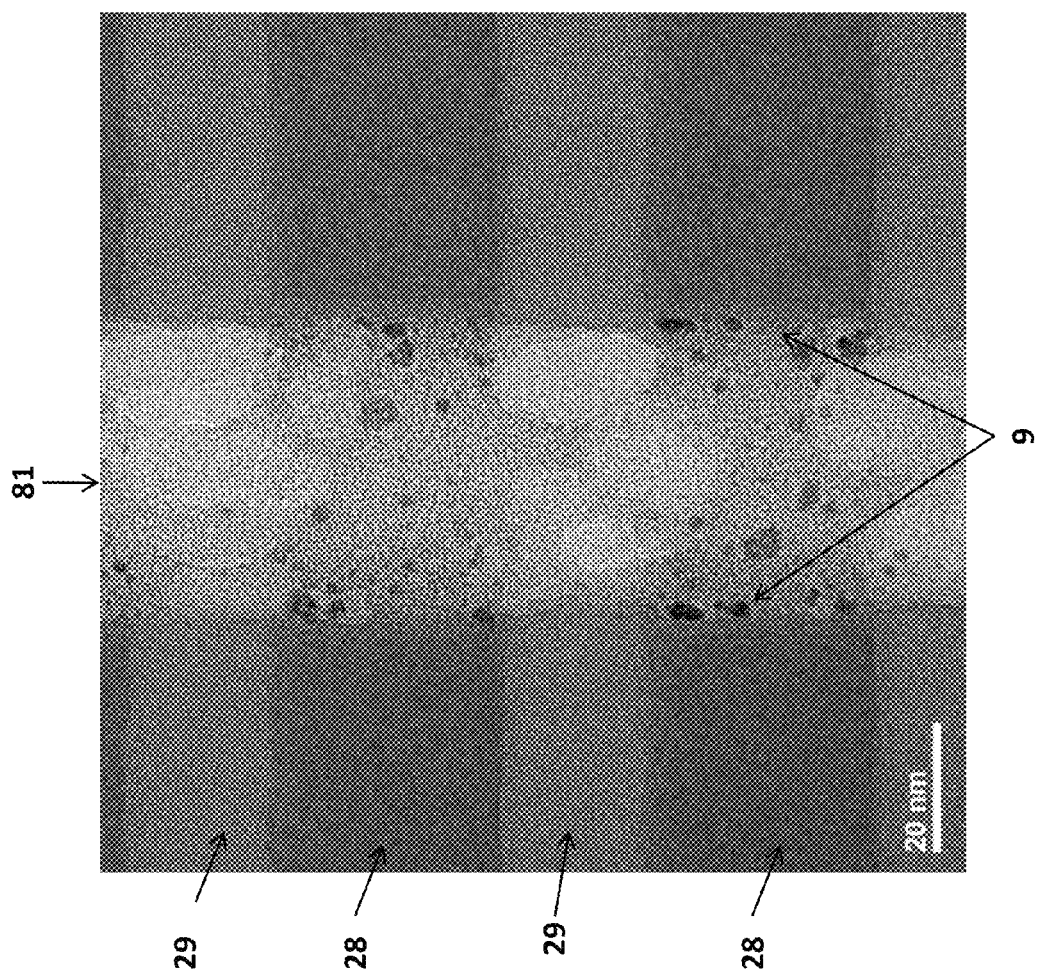

VERTICAL FLOATING GATE NAND WITH SELECTIVELY DEPOSITED ALD METAL FILMS

FIELD

The present invention relates generally to the field of semiconductor devices and specifically to three dimensional vertical NAND strings and other three dimensional devices and methods of making thereof.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active regions of the NAND string is formed by a relatively difficult and time consuming process involving repeated formation of sidewall spacers and etching of a portion of the substrate, which results in a roughly conical active region shape.

SUMMARY

An embodiment relates to a method of making a monolithic three dimensional NAND string that includes a semiconductor channel and a plurality of control gate electrodes. The method includes selectively forming a plurality of discrete charge storage regions using atomic layer deposition. The plurality of discrete charge storage regions includes at least one of a metal or an electrically conductive metal oxide.

Another embodiment relates to a monolithic three dimensional NAND string including a semiconductor channel, at least one end portion of the semiconductor channel extending substantially perpendicular to a major surface of a substrate. The NAND string also includes a plurality of control gate electrodes extending substantially parallel to the major surface of the substrate. The plurality of control gate electrodes comprise at least a first control gate electrode located in a first device level and a second control gate electrode located in a second device level located over the major surface of the substrate and below the first device level. The NAND string also includes a blocking dielectric located in contact with the plurality of control gate electrodes and a plurality of vertically spaced apart etch stop dielectric strips located in contact with the blocking dielectric. The plurality of vertically spaced apart etch stop dielectric strips comprise at least a first spaced apart etch stop dielectric strip located in the first device level and a second spaced apart etch stop dielectric strip located in the second device level. The NAND also includes a plurality of vertically spaced apart charge storage regions comprising at least one of a metal or an electrically conductive metal oxide and located in contact with the etch stop dielectric strips. The plurality of vertically spaced apart charge storage regions comprise at least a first spaced apart charge storage region located in the first device level and a second spaced apart charge storage region located in the second device level. The NAND string also includes a tunnel dielectric located between each one of the plurality of the vertically spaced apart metal charge storage regions and the semiconductor channel.

Another embodiment relates to a monolithic three dimensional NAND string including a semiconductor channel, at least one end portion of the semiconductor channel extending substantially perpendicular to a major surface of a substrate and a plurality of control gate electrodes extending substantially parallel to the major surface of the substrate. The plurality of control gate electrodes comprise at least a first control gate electrode located in a first device level and a second control gate electrode located in a second device level located over the major surface of the substrate and below the first device level. The NAND string also includes a blocking dielectric located in contact with the plurality of control gate electrodes, a continuous charge storage dielectric layer and a plurality of vertically spaced apart charge storage regions comprising at least one of ruthenium or $RuO_2$ and located in contact with the continuous charge storage dielectric layer. The plurality of vertically spaced apart ruthenium or $RuO_2$ charge storage regions comprise at least a first spaced apart ruthenium or $RuO_2$ charge storage region located in the first device level and a second spaced apart ruthenium or $RuO_2$ charge storage region located in the second device level. The NAND string also includes a tunnel dielectric located between the continuous charge storage dielectric layer and the semiconductor channel.

Another embodiment relates to a monolithic three dimensional NAND string including a semiconductor channel, at least one end portion of the semiconductor channel extending substantially perpendicular to a major surface of a substrate and a plurality of control gate electrodes extending substantially parallel to the major surface of the substrate. The plurality of control gate electrodes comprise at least a first control gate electrode located in a first device level and a second control gate electrode located in a second device level located over the major surface of the substrate and below the first device level. The NAND string also includes a blocking dielectric located in contact with the plurality of control gate electrodes and a plurality of vertically spaced apart nanoparticle charge storage regions comprising at least one of ruthenium or $RuO_2$ nanoparticles. The plurality of vertically spaced apart nanoparticle charge storage regions comprise at least a first spaced apart nanoparticle charge storage region located in the first device level and a second spaced apart nanoparticle charge storage region located in the second device level. The NAND string also includes a tunnel dielectric located between each one of the plurality of the vertically spaced apart metal nanoparticle charge storage regions and the semiconductor channel.

BRIEF DESCRIPTION OF THE DRAWINGS

FIGS. 1A and 1B are respectively side cross sectional and top cross sectional views of a conventional NAND string. FIG. 1A is a side cross sectional view of the device along line Y-Y' in FIG. 1B, while FIG. 1B is a side cross sectional view of the device along line X-X' in FIG. 1A.

FIGS. 2A and 2B are respectively side cross sectional and top cross sectional views of another conventional NAND string. FIG. 2A is a side cross sectional view of the device along line Y-Y' in FIG. 2B, while FIG. 2B is a side cross sectional view of the device along line X-X' in FIG. 2A.

FIGS. 5A-5E illustrate a method of making a NAND string according to an embodiment.

FIGS. 6A-6E illustrate a method of making a NAND string according to an embodiment.

FIGS. 7A-7D illustrate a method of making a NAND string according to an embodiment.

FIGS. 9A-9E illustrate a method of making a NAND string according to an embodiment.

FIGS. 10A-10F illustrate a method of making a NAND string according to an embodiment.

FIG. 11C is a TEM micrograph illustrating selective conformal coating of a ruthenium floating gate layer on polysilicon layers according to another embodiment in which the polysilicon layers are not recessed in an OPOP stack.

DETAILED DESCRIPTION

Many conventional three dimensional NAND memories store charge in silicon nitride charge storage dielectric layers. The conventional devices suffer from slow erase times, poor data retention and charge spreading. The inventors have realized that low work function conducting floating gates provide better performance than charge storage silicon nitride dielectric layers.

The inventors have discovered that the deposition of continuous or discontinuous charge storage layers may be advantageously carried out with atomic layer deposition (ALD). The ALD process is inherently selective due to surface sensitivity. Further, good results are easier to achieve with the ALD process versus chemical vapor deposition (CVD) process, which requires fine tuning of gas flows.

Additionally, the self-limiting nature of ALD allows more accurate and reproducible deposition than CVD. Additionally, the ALD process is shown to be able to deposit discrete or continuous films. Therefore, nanoparticle floating gates can be deposited via ALD on vertical surfaces and are further advantageous because they give better endurance and data retention than continuous charge storage films. In addition, the ALD methods discussed below are shown to be selective on oxide/poly/oxide/poly (OPOP) and oxide/nitride/oxide/nitride (ONON) structures unlike prior art methods. Furthermore, ALD deposition thickness is largely insensitive to wafer temperature, unlike CVD which can be very temperature sensitive. Since the charge storage layers (e.g., floating gate layers) are relatively thin, if there is a drift or non-uniformity in temperature of the deposition surfaces, then this would translate to large changes in floating gate thickness if CVD is used to deposit the floating gates, but not if ALD is used to deposit the floating gates. As discussed in more detail below, selectivity of floating gate deposition on polysilicon or nitride in both ONON and OPOP stacks are demonstrated.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 3A:
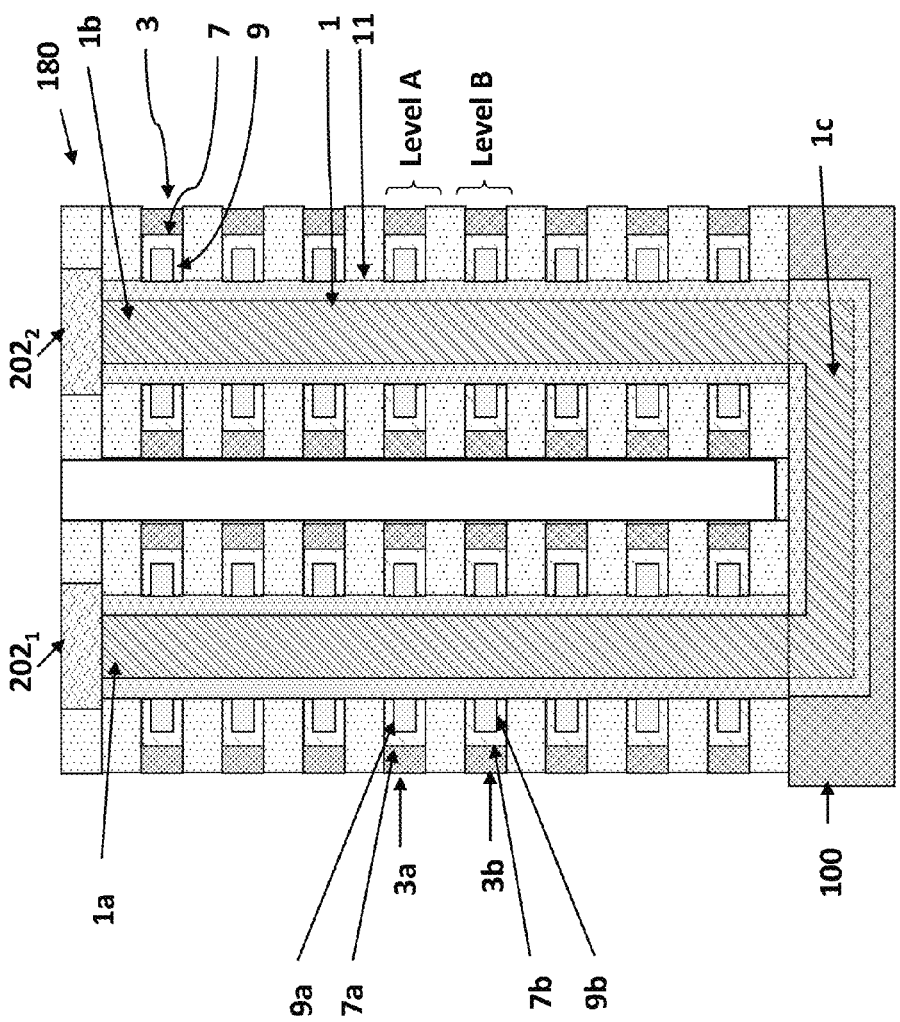
FIG. 3A is a side cross sectional view of a conventional NAND string of an embodiment with a U-shaped channel.
Figure 3B:
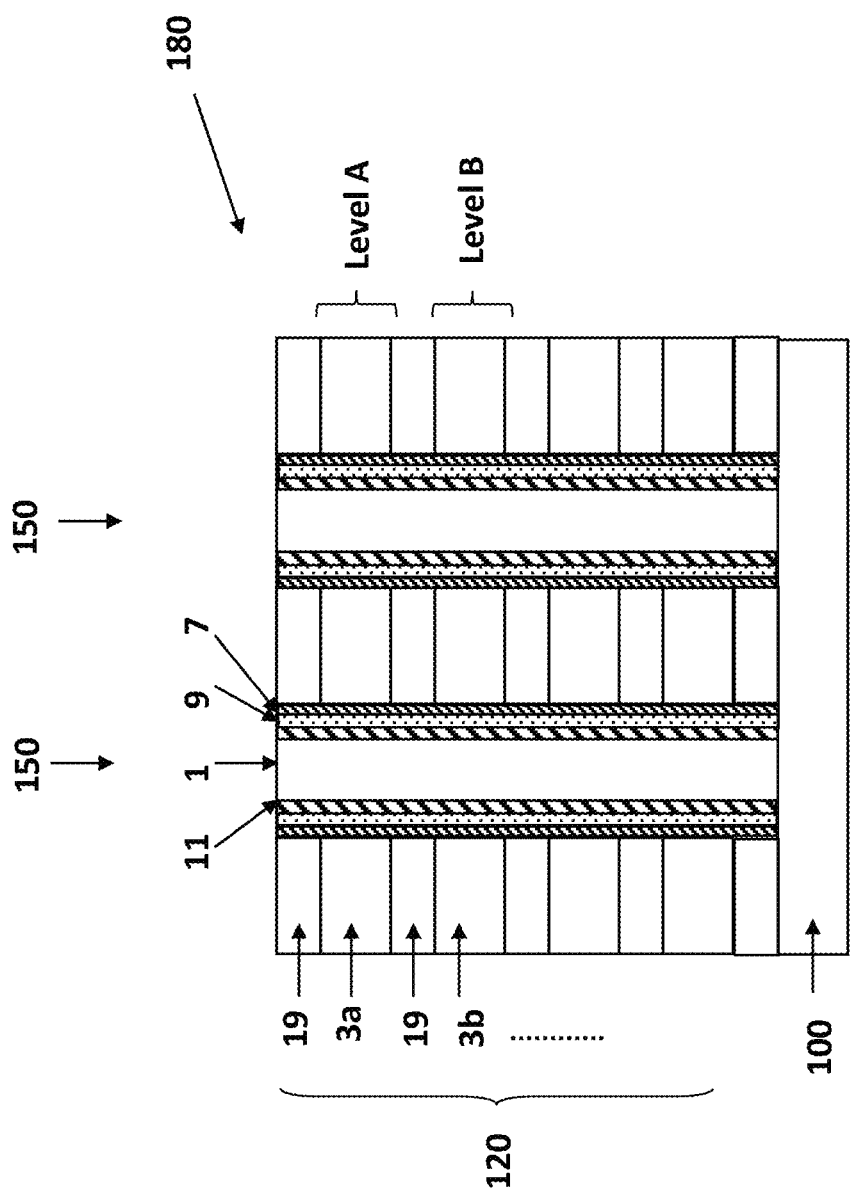
FIG. 3B is a side cross sectional view of another conventional NAND string.

In some embodiments, the monolithic three dimensional NAND string 180 comprises a semiconductor channel 1 having at least one end portion extending substantially perpendicular to a major surface 100a of a substrate 100, as shown in FIGS. 1A, 2A and 3B. "Substantially perpendicular to" (or "substantially parallel to") means within 0-10°. For example, the semiconductor channel 1 may have a pillar shape and the entire pillar-shaped semiconductor channel extends substantially perpendicularly to the major surface of the substrate 100, as shown in FIGS. 1A, 2A and 3B. In these embodiments, the source/drain electrodes of the device can include a lower electrode 102 provided below the semiconductor channel 1 and an upper electrode 202 formed over the semiconductor channel 1, as shown in FIGS. 1A and 2A.

Alternatively, the semiconductor channel 1 may have a U-shaped pipe shape, as shown in FIG. 3A. The two wing portions 1a and 1b of the U-shaped pipe shape semiconductor channel may extend substantially perpendicular to the major surface 100a of the substrate 100, and a connecting portion 1c of the U-shaped pipe shape semiconductor channel 1 connects the two wing portions 1a, 1b extends substantially parallel to the major surface 100a of the substrate 100. In these embodiments, one of the source or drain electrodes $202_1$ contacts the first wing portion of the semiconductor channel from above, and another one of a source or drain electrodes $202_2$ contacts the second wing portion of the semiconductor channel 1 from above. An optional body contact electrode (not shown) may be disposed in the substrate 100 to provide body contact to the connecting portion of the semiconductor channel 1 from below. The NAND string's select or access transistors are not shown in FIGS. 1-3B for clarity.

In some embodiments, the semiconductor channel 1 may be a filled feature, as shown in FIGS. 2A, 2B, 3A and 3B. In some other embodiments, the semiconductor channel 1 may be hollow, for example a hollow cylinder filled with an insulating fill material 2, as shown in FIGS. 1A-1B. In these embodiments, an insulating fill material 2 may be formed to fill the hollow part surrounded by the semiconductor channel 1. The U-shaped pipe shape semiconductor channel 1 shown in FIG. 3A and/or the channel 1 shown in FIG. 3B may alternatively be a hollow cylinder filled with an insulating fill material 2, shown in FIGS. 1A-1B.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recyrstallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3, as shown in FIGS. 1A-1B, 2A-2B, 3A and 3B. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A. The control gate material may comprise any one or more suitable conductive or semiconductor control gate material known in the art, such as doped polysilicon, tungsten, tungsten nitride, copper, aluminum, tantalum, titanium, cobalt, titanium nitride or alloys thereof. For example, the control gate material in FIGS. 1A, 2A and 3A may comprise a conductive metal or metal alloy, such as tungsten and/or titanium nitride, while the control gate material in FIG. 3B may comprise doped polysilicon.

A blocking dielectric 7 is located adjacent to the control gate(s) 3 and may surround the control gate 3, as shown in FIGS. 1A, 2A and 3A. Alternatively, a straight blocking dielectric layer 7 may be located only adjacent to an edge (i.e., minor surface) of each control gate 3, as shown in FIG. 3B. The blocking dielectric 7 may comprise a layer having plurality of blocking dielectric segments located in contact with a respective one of the plurality of control gate electrodes 3, for example a first dielectric segment 7a located in device level A and a second dielectric segment 7b located in device level B are in contact with control electrodes 3a and 3b, respectively, as shown in FIG. 3A. Alternatively, the blocking dielectric 7 may be a straight, continuous layer, as shown in FIG. 3B, similar to the device described in U.S. Pat. No. 8,349,681 issued on Jan. 8, 2013 and incorporated herein by reference in its entirety.

The monolithic three dimensional NAND string also comprise a charge storage region 9. The charge storage region 9 may comprise one or more continuous layers which extend the entire length of the memory cell portion of the NAND string, as shown in FIG. 3B. For example, the charge storage region 9 may comprise an insulating charge trapping material, such as a silicon nitride layer.

Alternatively, the charge storage region may comprise a plurality of discrete charge storage regions 9, as shown in FIGS. 1A, 2A and 3A. The plurality of discrete charge storage regions 9 comprise at least a first discrete charge storage region 9a located in the device level A and a second discrete charge storage region 9b located in the device level B, as shown in FIG. 3A. The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the discrete charge storage regions 9 may comprise an insulating charge trapping material, such as silicon nitride segments.

The tunnel dielectric 11 of the monolithic three dimensional NAND string is located between charge storage region 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other insulating materials. The blocking dielectric 7 and/or the tunnel dielectric 11 may include multiple layers of silicon oxide, silicon nitride and/or silicon oxynitride (e.g., ONO layers).

Figure 4:
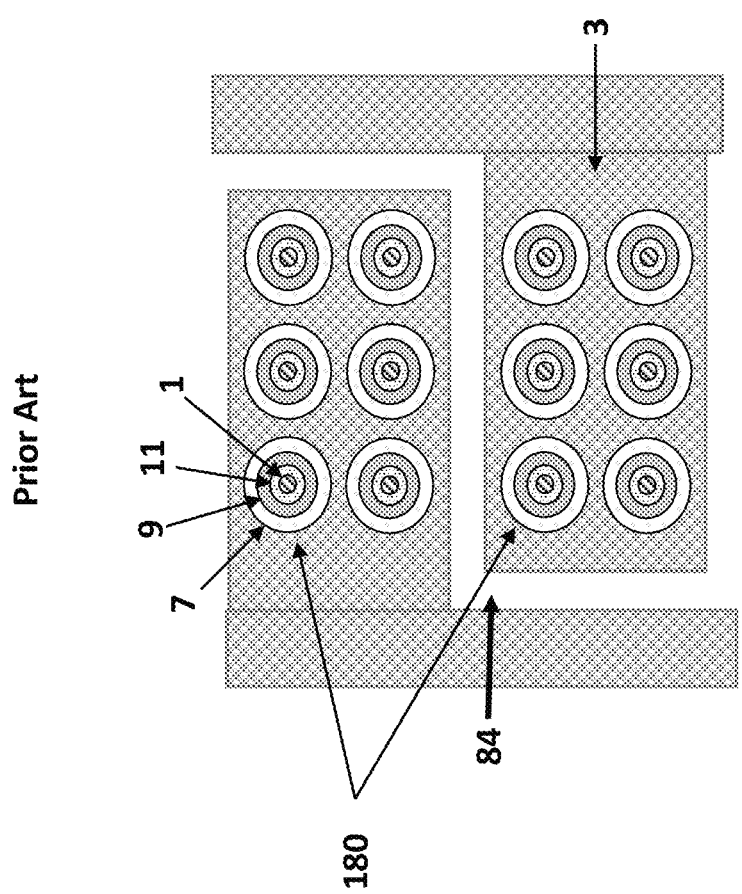
FIG. 4 is a top schematic view of a portion of a conventional memory device comprising NAND strings.

FIG. 4 is a top schematic view illustrating a portion of a conventional memory device comprising NAND strings 180 having channels 1 located in respective memory holes 81 (e.g., front side openings). In this device, the memory holes 81 are circular, thereby resulting in cylindrical pillar shaped NAND strings 180. From the top view, the tunnel dielectric 11, charge storage region 9 and blocking dielectric form concentric rings around the channel 1. The control gate 3 in each device level is generally slab shaped. A back side opening 84, such as a trench, electrically separates adjacent control gates 3 and NAND strings 180 from each other. As discussed in more detail below, the back side opening 84 may be used in the manufacture of NAND strings 180 according to some embodiments.

A first embodiment of making a NAND string 180 is illustrated in FIGS. 5A-5E. As illustrated in FIG. 5A, a stack 120 of alternating first material layers 121 and second material layers 122 are provided over a major surface 100a of a substrate 100. In an embodiment, the first material layers 121 comprise an insulating material, such as $SiO_2$, and the second material layers 122 comprise a sacrificial material, such as intrinsic polysilicon or silicon nitride. The method also includes forming a front side opening 81 (e.g. a memory hole) in the stack 120 as illustrated in FIG. 5A. A select gate layer (not shown) is located over the stack 120.

As illustrated in FIG. 5B, a floating gate material is selectively deposited on the exposed surfaces (e.g. edge surfaces) of the second material layers 122 exposed in the openings 81 to form discrete charge storage regions 9, such as floating gates. That is, discrete charge storage regions 9 are not formed on the exposed surfaces of the first material layers 121. In an embodiment, the floating gate material comprises continuous strips or one or more layers of nanoparticles of ruthenium or electrically conductive $RuO_2$.

In an embodiment, the floating gate material is selectively deposited by atomic layer deposition (ALD). The ruthenium and/or $RuO_2$ may be formed by supplying a volatile ruthenium precursor, such as $RuO_4$. One or more $RuO_2$ monolayers may be formed using atomic layer deposition. The one or more $RuO_2$ monolayers may be exposed to a reducing atmosphere to fully or partially reduce the deposited one or more $RuO_2$ monolayers to one or more Ru monolayers. Alternatively, the reducing step may be omitted in all or some cycles if it is desired to form $RuO_2$ or composite Ru+$RuO_2$ floating gates. The $RuO_2$ deposition and Ru reducing steps (i.e., 1 ALD cycle) may be repeated multiple times to form the plurality of discrete charge storage regions. A hydrogen based forming gas, such as 4% hydrogen and 96% nitrogen, may be supplied as the reducing atmosphere for the ruthenium oxide Preferably, the atomic layer deposition is performed by cycling, such as with more than 25 cycles, such as 25-40 cycles, to form continuous strips of Ru and/or $RuO_2$ or less than 25 cycles, e.g. less than 15 cycles to form Ru and/or $RuO_2$ nanoparticles.

Without wishing to be bound by a particular theory, the inventors believe that ruthenium or $RuO_2$ discrete charge storage regions 9 may be selectively deposited using atomic layer deposition on hydrophilic but not on hydrophobic material surfaces. In a non-limiting embodiment, the step of selectively forming the plurality of discrete charge storage regions 9 using atomic layer deposition comprises selectively forming a plurality of at least one of ruthenium or $RuO_2$ discrete charge storage regions 9 using atomic layer deposition in an opening 81 in the stack 120 of alternating hydrophobic first material layers 121 and hydrophilic second material layers 122. At least one of ruthenium or $RuO_2$ discrete charge storage regions are formed on exposed portions (e.g. edge portions) of hydrophilic second material layers 122 but not on exposed portions of hydrophobic first material layers 121, such as $SiO_2$ layers.

ALD is surface sensitive deposition process, i.e., the film growth is strongly dependent on the substrate's surface characteristics. Without wishing to be bound by a particular theory, the inventors believe that the difference in nucleation may be a function of the hydrophobicity of the surfaces, which results in different contact angles for different surfaces. That is, the more hydrophilic the surface, the lower contact angle. Further, a lower contact angle may result in denser films (i.e. denser floating gate segments 9). However, the difference in hydrophobicity may be just one contributing factor in the above described selective deposition. For example, without wishing to be bound by a particular theory, it is believed that differences in the ability of a given surface to initiate catalytic reduction may be another contributing factor in the above described selective deposition. Other factors may also contribute to the selective deposition in addition to or instead of the above mentioned factors.

As illustrated in FIG. 5C, a tunnel dielectric 11 may then be formed in the front side opening 81 over the discrete charge storage regions 9 on the exposed surfaces of the first material layers 121. Next, a channel 1 may be formed over the tunnel dielectric 11.

Next, as illustrated in FIG. 5D, a back side opening 84, such as a trench, is formed in the stack 120. The second material layers 122 are then selectively removed by selective etching via the back side opening 84 to form back side recesses 64. As illustrated in FIG. 5E, a blocking dielectric 7 is formed in the back side opening 84 and the back side recesses 64. The blocking dielectric 7 is conformally deposited in the back side recesses 64. Portions of the blocking dielectric 7 in each of the back side recesses 62 have a clam shape 107 with a vertical portion 107c adjacent the discrete charge storage regions 9 and horizontal portions 107a, 107b adjacent the first material layers 121. A control gate 3 may then be formed in the opening of the clam shaped portion 107 of the blocking dielectric 7, by depositing one or more electrically conductive layers, such as W, TiN, WN, etc., in the back side opening 84 and back side recesses 64 and then removing the electrically conductive layer(s) from the back side opening 84 to leave control gates 3 in the clam shaped portions 107 of the blocking dielectric 7.

FIGS. 6A-6E illustrate another embodiment of making a NAND string 180. In this embodiment, similar to the previous embodiment, a stack 120 of alternating first material layers 121 and second material layers 122 are provided over a major surface 100a of a substrate 100 as illustrated in FIG. 6A. The first material layers 121, may comprise may comprise an oxide, such as $SiO_2$, while the second material layers 122 may comprise intrinsic polysilicon. A front side opening 81 is formed in the stack 120. As illustrated in FIG. 6B, discrete charge storage regions 9 are selectively formed in the front side opening 81 on the exposed surfaces of the second material layers 122.

Next, the first material layers 121 are selectively etched to form front side recesses 62 between adjacent second material layers 122 as illustrated in FIG. 6C. The formation of the front side recesses 62, results in portions of top and bottom surfaces of the second material layers 122 being exposed.

Next, as illustrated in FIG. 6D, the surfaces of the second material layers 122 exposed in the recesses 62 are thermally oxidized to form a dielectric etch stop layer 17 between the discrete charge storage regions 9 and the remaining unoxidized portion 25 of the second material layers 122. The thermal oxidation is preferably performed in an atmosphere containing only water vapor (instead of oxygen gas, $O_2$) as the oxidant, since $H_2O$ generally forms the desired, non-volatile $RuO_2$, while $O_2$ forms undesirable, volatile $RuO_4$ after reacting with the Ru floating gate. Thus, the benefit of using water vapor rather than oxygen gas as a polysilicon oxidant is that water vapor is less likely to form the volatile $RuO_4$ after reacting with Ru. The volatile $RuO_4$ will immediately get removed from the structure and is therefore not desirable. In contrast, $RuO_2$ is non-volatile and stable and will continue to function as a floating gate. Therefore, it is preferred to avoid using oxygen gas for oxidizing polysilicon and all oxygen gas should be removed from the oxidizing ambient to the extent possible (e.g., a trace amount of oxygen gas may still remain if it is not possible to remove it).

Next, as illustrated in FIG. 6E, back side opening 84 is formed in the stack 120. Then, the second material layers 122 are selectively removed through the back side opening 84 to form back side recesses 64 using the etch stop layers 17 as an etch stop. A blocking dielectric 7 is deposited through the back side opening 84, forming a clam shaped dielectric portion 107 in the back side recesses 64, such that the vertical portion 107C of the blocking dielectric 7 contacts the etch stop layer 17. The control gates 3 are formed in the clam shaped dielectric portion 107. In addition, a tunnel dielectric 11 is formed over the discrete charge storage regions 9 and a channel formed over the tunnel dielectric 11 inside the front side opening 81 after forming etch stop layer 17 and before or after forming the back side opening 84.

FIG. 6E illustrates a three-dimensional NAND string 180 made by the above process. The monolithic three dimensional NAND string 180 includes a semiconductor channel 1 in which at least one end portion of the semiconductor channel 1 extends substantially perpendicular to a major surface 100a of the substrate 100. The NAND string 180 includes a plurality of control gate electrodes 3 extending substantially parallel to the major surface 100a of the substrate 100. The plurality of control gate electrodes 3 comprise at least a first control gate electrode 3a located in a first device level and a second control gate electrode 3b located in a second device level located over the major surface 100a of the substrate 100 and below the first device level. The NAND string also includes a blocking dielectric 7 located in contact with the plurality of control gate electrodes 3, a plurality of vertically spaced apart etch stop dielectric strips 17 located in contact with the blocking dielectric 7. The plurality of vertically spaced apart etch stop dielectric strips comprise at least a first spaced apart etch stop dielectric strip 17a located in the first device level and a second spaced apart etch stop dielectric strip 17b located in the second device level. The NAND string 180 also includes a plurality of vertically spaced apart charge storage regions 9 comprising at least one of a metal or an electrically conductive metal oxide and located in contact with the etch stop dielectric strips 17. The plurality of vertically spaced apart charge storage regions 9 comprise at least a first spaced apart charge storage region 9a located in the first device level and a second spaced apart charge storage region 9b located in the second device level. The NAND string also includes a tunnel dielectric 11 located between each one of the plurality of the vertically spaced apart metal charge storage regions 9 and the semiconductor channel 1.

In an embodiment, the plurality of vertically spaced apart etch stop dielectric strips 17 comprise a plurality of silicon oxide strips and the plurality of vertically spaced apart charge storage regions 9 comprise a plurality of at least one of ruthenium or $RuO_2$ strips. A "strip" is a three dimensional configuration in which two of the three dimensions are substantially larger, such as twice or more as large, than the third (e.g. thickness) dimension. In an alternative embodiment, the plurality of vertically spaced apart charge storage regions comprise a plurality of at least one of ruthenium or $RuO_2$ nanoparticles.

FIGS. 7A-7D illustrate another embodiment of making a NAND string 180. As in the previous embodiments, the stack 120 of alternating first material layers 121 and second material layers 122 is provided over the major surface 100a of the substrate 100, as illustrated in FIG. 7A. The first material layers 121, may comprise an oxide, such as $SiO_2$ and the second material layers 122 may comprise intrinsic polysilicon. A front side opening 81 is formed through the stack 120.

Next, as illustrated in FIG. 7B, the second material layers 121 are selectively etched through the front side opening 81 to form shallow front side recesses 62. Then, a first floating gate material is deposited in the front side recesses 62 to form first discrete charge storage regions 9a. In an embodiment, the first floating gate material comprises boron doped polysilicon. The first discrete charge storage regions 9a may be formed by any suitable method, such as selected epitaxial growth (SEG) on exposed portions of polysilicon layers 122 or by depositing a polysilicon layer into the front side opening 81 and front side recesses 62 and etching the polysilicon layer such that only first discrete charge storage regions 9a remain in the front side openings 62.

Next, as illustrated in FIG. 7C, a second floating gate material is selectively deposited on the first discrete charge storage regions 9a to form second discrete charge storage regions 9b (i.e. the second floating gate material does not deposit on the exposed surfaces of the first material layers 121 in the front side opening 81). The second discrete charge storage regions 9b may be made of any suitable material, such as ruthenium. The second discrete charge storage regions 9b may be formed by any suitable method, such as by ALD, as described above.

As illustrated in FIG. 7D, a tunnel dielectric 11 is formed in the front side opening 81 over first and second discrete charge storage regions 9a, 9b. Then, a channel 1 is formed over the tunnel dielectric 11. In addition, a back side opening 84 is formed in the stack 120. Then, the second material layers 122 are removed to form back side recesses 64. The first discrete charge storage regions 9a may act as an etch stop during the selective etching step. A blocking dielectric 7 is then formed in the back side opening 84 and the back side recesses 64. Control gates 3 are then formed in clam shaped portions 107 of the blocking dielectric 7.

Figure 8C:
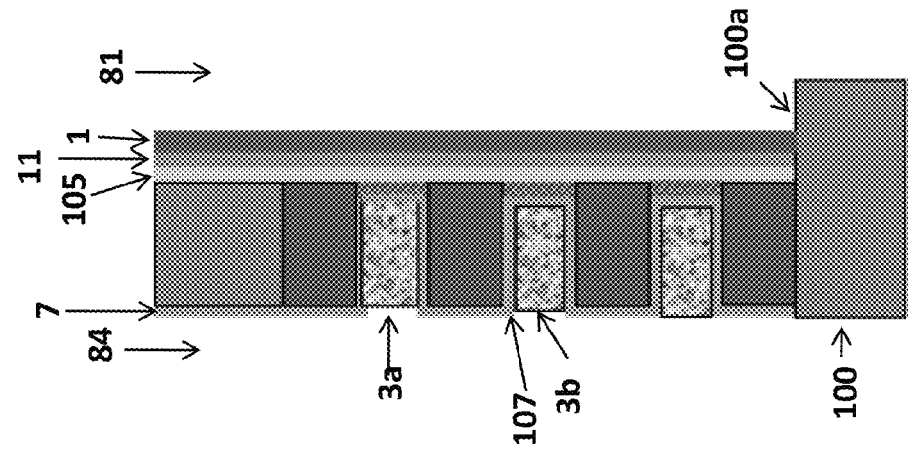
FIGS. 8A-8C illustrate a method of making a NAND string according to an embodiment.
Figure 8B:
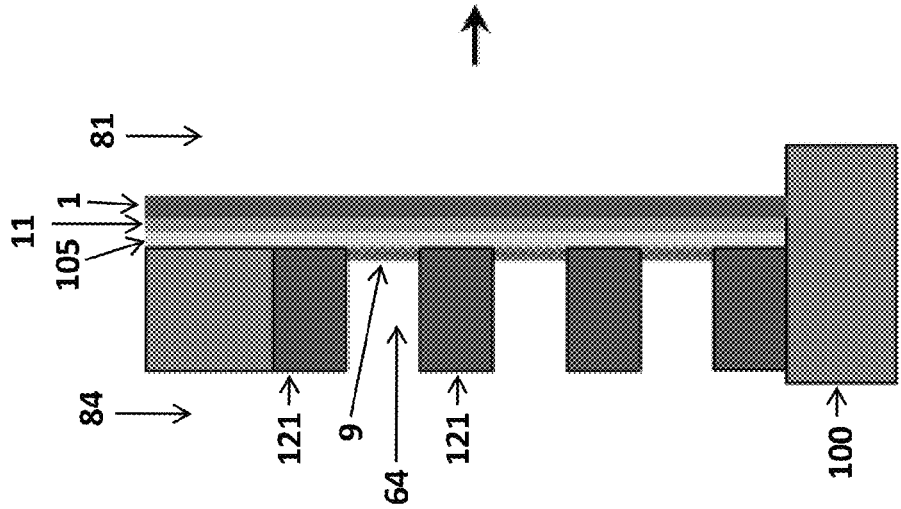
Figure 8A:
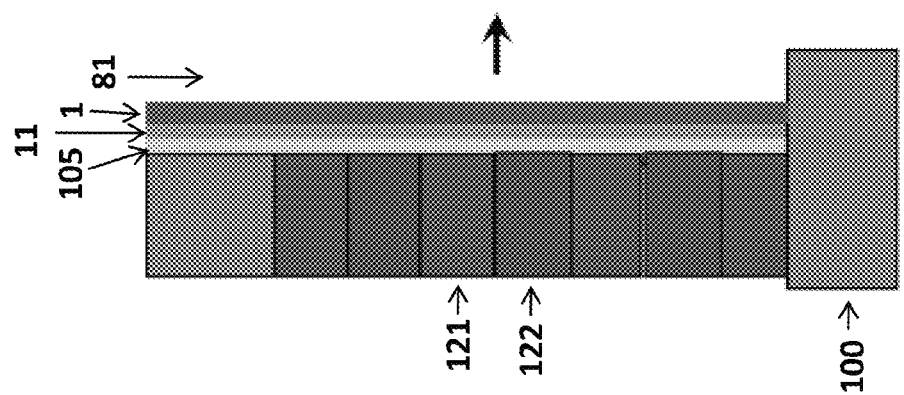

FIGS. 8A-8C illustrate another embodiment of making a hybrid NAND string 180. In this embodiment the stack 120 of alternating first material layers 121 and second material layers 122 is provided, as illustrated in FIG. 8A. A front side opening (e.g. memory hole) 81 is formed in the stack 120. A charge storage dielectric layer 105 is formed in the front side opening 81. The charge storage dielectric layer 105 may be formed of any suitable insulating material, such as silicon nitride. Next, a tunnel dielectric 11 is formed over the charge storage dielectric layer 105. A channel 1 is formed over the tunnel dielectric 11.

Next, as illustrated in FIG. 8B, the back side opening 84 is formed in the stack 120. Second material layers 122 are then selectively removed via the back side opening 84 to form back side recesses 64 between adjacent first material layers 122. Charge storage dielectric layer 105 may act as an etch stop in the etching process. Then, discrete charge storage regions 9 are selectively formed in the back side recesses 64. In an embodiment, the step of selectively forming the plurality of discrete charge storage regions 9 using atomic layer deposition comprises selectively forming the plurality of discrete charge storage regions 9a (these are Ru/RuO2 layers, and are conductive floating gates) using atomic layer deposition on exposed portions of the charge storage dielectric layer (which relies on charge trapping for storage) 105 in the back side recesses 64 but not on exposed portions of the first material layers 121 in the back side recesses 64. In an embodiment, the charge storage material may be formed of ruthenium or $RuO_2$. The combination of the dielectric charge trap and floating gate (Ru/RuO2) constitutes a hybrid structure which may perform better than charge storage layers which use either the dielectric charge trap or the conductive floating gates alone.

Next, as illustrated in FIG. 8C, a blocking dielectric 7 is formed in the back side opening 84 and in the back side recesses 64. Control gates 3 and may then be formed in a clam shaped portion 107 of the blocking dielectric 7.

As is shown in FIG. 8C, a monolithic three dimensional NAND string 180 made according to this embodiment includes a semiconductor channel 1 with at least one end portion of the semiconductor channel 1 extending substantially perpendicular to the major surface 100a of the substrate 100. The NAND string 180 also includes a plurality of control gate electrodes 3 extending substantially parallel to the major surface 100a of the substrate 100. The plurality of control gate electrodes 3 comprise at least a first control gate electrode 3a located in a first device level and a second control gate electrode 3b located in a second device level located over the major surface 100a of the substrate 100 and below the first device level. The NAND string 180 also includes a blocking dielectric 7 located in contact with the plurality of control gate electrodes 3, a continuous charge storage dielectric layer 105 and a plurality of vertically spaced apart charge storage regions 9 comprising at least one of ruthenium or $RuO_2$ and located in contact with the continuous charge storage dielectric layer 105. The plurality of vertically spaced apart ruthenium or $RuO_2$ charge storage regions 9 comprise at least a first spaced apart ruthenium or $RuO_2$ charge storage region 9a located in the first device level and a second spaced apart ruthenium or $RuO_2$ charge storage region 9b located in the second device level. The NAND string 180 also includes a tunnel dielectric 11 located between the continuous charge storage dielectric layer 105 and the semiconductor channel 1.

FIGS. 9A-E illustrate another embodiment of making a hybrid NAND string 180. In this embodiment, the stack 120 of alternating first material layers 121 and second material layers 122 is provided, as illustrated in FIG. 9A. In this embodiment, the first material layers 121 may comprise silicon oxide the second material layers 122 may comprise silicon nitride. A front side opening 81 is formed in the stack 120.

An etch stop layer 5 is formed in a front side opening 81 over the exposed surfaces of the first and second material layers 121, 122. In an embodiment, the etch stop layer 5 is $SiO_2$. Other suitable materials may also be used. A charge storage dielectric layer 105 is formed over the etch stop layer 5. A tunnel dielectric 11 is formed over the charge storage dielectric layer 105. A semiconductor channel 1 is formed over the tunnel dielectric 11. In this embodiment, a fill material 2 is formed over the channel 1 in the front side opening 81. The fill material 2 may also be formed in the other embodiments discussed herein.

Next, as illustrated in FIG. 9B, a back side opening 84 is formed in the stack. Then, the second material layers 122 are selectively removed via the back side opening 84 to form back side recesses 64 using the etch stop layer 5 as an etch stop. As illustrated in FIG. 9C, the exposed portion of the etch stop layer 5 in the back of the back side recesses 64 are removed to expose the charge storage dielectric layer 105 in the back side recesses 64. The etch stop layer 5 may be removed with a dilute HF wet etch.

Next, as illustrated in FIG. 9D, charge storage material is selectively deposited on the exposed surface of the charge storage dielectric layer 105 in the back side recesses 64 but not on the exposed portions of the first material layers 121 exposed in the back side recesses 64 to form discrete charge storage regions 9 (e.g. floating gates 9a and 9b in different device levels). In an embodiment, the charge storage material is ruthenium and/or $RuO_2$. Preferably, the charge storage material is deposited by ALD. Because the charge storage dielectric layer 105 is silicon nitride but the first material layers 121 are $SiO_2$, ruthenium is selectively deposited only on the charge storage dielectric layer 105 in the back side recesses 64 via ALD. The combination of the charge storage dielectric layer 105 (e.g., silicon nitride layer) and the adjacent discreet metal or metal oxide floating gates 9a, 9b forms a hybrid structure in the NAND string.

Next, as illustrated in FIG. 9E, a blocking dielectric 7 is deposited in the backside opening 84 and the in the back side recesses 64 such that vertical portion 107C contacts the floating gates 9a, 9b. As in the previous embodiments, the blocking dielectric 7 includes a clam shaped portion 107 in the back side recesses 64. In addition, a barrier layer 4 may be deposited on the blocking dielectric 7, followed by formation of the control gates 3. The barrier layer 4 prevents diffusion of the control gate 3 material into the blocking dielectric 7. In an embodiment, the control gates comprise tungsten and the barrier layer comprises TiN.

FIGS. 10A-10F illustrate another embodiment of making a NAND string 180. In this embodiment the stack 120 of alternating first material layers 121 and second material layers 122 is provided, as illustrated in FIG. 10A. A front side opening 81 is formed in the stack 120. As illustrated in FIG. 10B, the second material layers 122 are selectively etched to form front side recesses 62 in layers 122.

Next, as illustrated in FIG. 10C, a first floating gate material is deposited in the front side recesses 62 via the front side opening 81 to form first discrete charge storage regions 9a. The first floating gate material may be any suitable material, such as boron doped polysilicon deposited using the methods described above with respect to FIG. 7C. Then, a tunnel dielectric 11 is formed over the exposed surfaces of the first material layers 121 and the first discrete charge storage regions 9a in the front side opening 81. A channel 1 is formed over the tunnel dielectric 11.

Next, as illustrated in FIG. 10D, a back side opening 84 is formed in the stack 120. The second layers 122 are then selectively removed via the back side opening 84 to form back side recesses 64 and expose the first discrete charge storage regions 9a in the back side recesses 64. Then, as illustrated in FIG. 10E, a second floating gate material is selectively formed on the exposed surface of the first discrete charge storage regions 9a in the back side recesses 64 to form second discrete charge storage regions 9b. In an embodiment, the second floating gate material comprises ruthenium and/or $RuO_2$ formed by ALD through the back side opening 84. After forming the second discrete charge storage regions 9b, a blocking dielectric 7 is formed in the back side opening 84 and in the back side recesses 64 in contact with second discrete charge storage regions 9b, as illustrated in FIG. 10F. Control gates 3 are then formed in clam shaped portions 107 of the blocking dielectric 7 in the back side recesses 64.

Figure 11B:
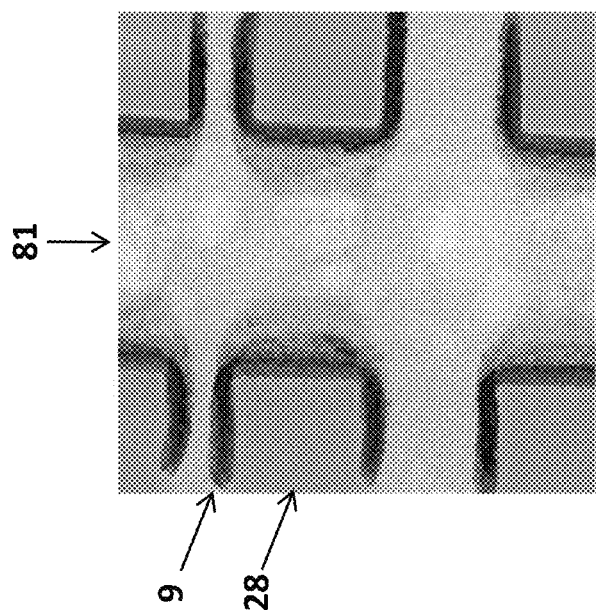
FIG. 11B is a micrograph of a close up of the embodiment illustrated in FIG. 11A.
Figure 11A:
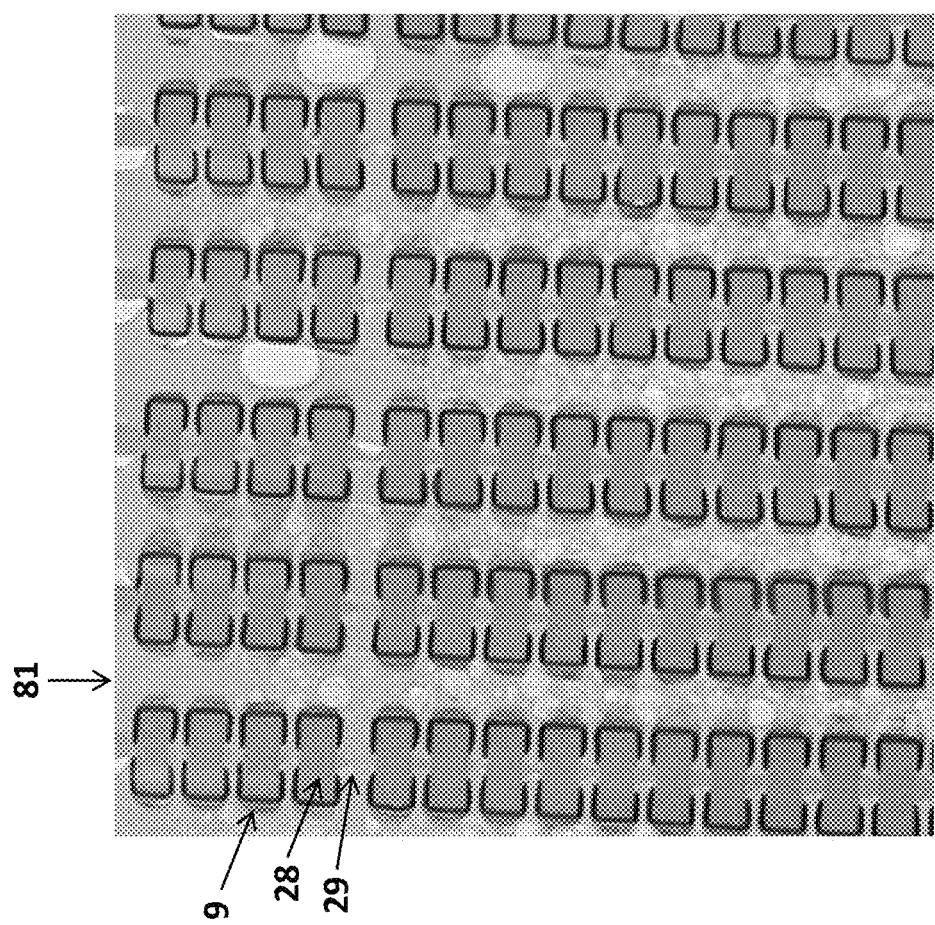
FIG. 11A is a transmission electron microscope (TEM) micrograph illustrating selective conformal coating of a ruthenium floating gate layer on polysilicon layers according to an embodiment. This structure was formed by selectively recessing the oxide layers using a selective wet etch in an OPOP (silicon oxide/polysilicon) stack.

FIGS. 11A, 11B and 11C are TEM micrographs that illustrate the ability to form selective conformal coatings of a ruthenium charge storage layer 9 on polysilicon relative to $SiO_2$. FIG. 11B is a close up of the embodiment illustrated in FIG. 11A. In the embodiment illustrated in FIGS. 11A and 11B, the $SiO_2$ layers 29 are recessed relative to the polysilicon layers 28 by dilute HF dip. This is done to remove any possible surface polymer. As can be seen in FIGS. 11A and 11B, the ruthenium charge storage layer 9 selectively and conformally forms only on the exposed surfaces of the polysilicon layers 28 in the front side opening 81. Also, selectivity is maintained with recessed oxide layers, indicating that selectivity of deposition is not due to surface polymer.

In the embodiment of FIG. 11C, the oxide layers 29 are not recessed and there may be some surface polymer remaining in the opening 81. FIG. 11C shows selective deposition of the ruthenium charge storage layer 9 on the polysilicon layers 28 where the edge surfaces of the polysilicon layers 28 and oxide layers 29 are flush with each other in the opening 81. In other words, it is not necessary to etch back the oxide layers 29 in the OPOP stack in order obtain selective ruthenium deposition on the polysilicon layers 28 even though there could be some surface polymer remaining in the opening 81, as long as the surface polymer does not completely coat the entire sidewalls of the opening.

Figure 12A:
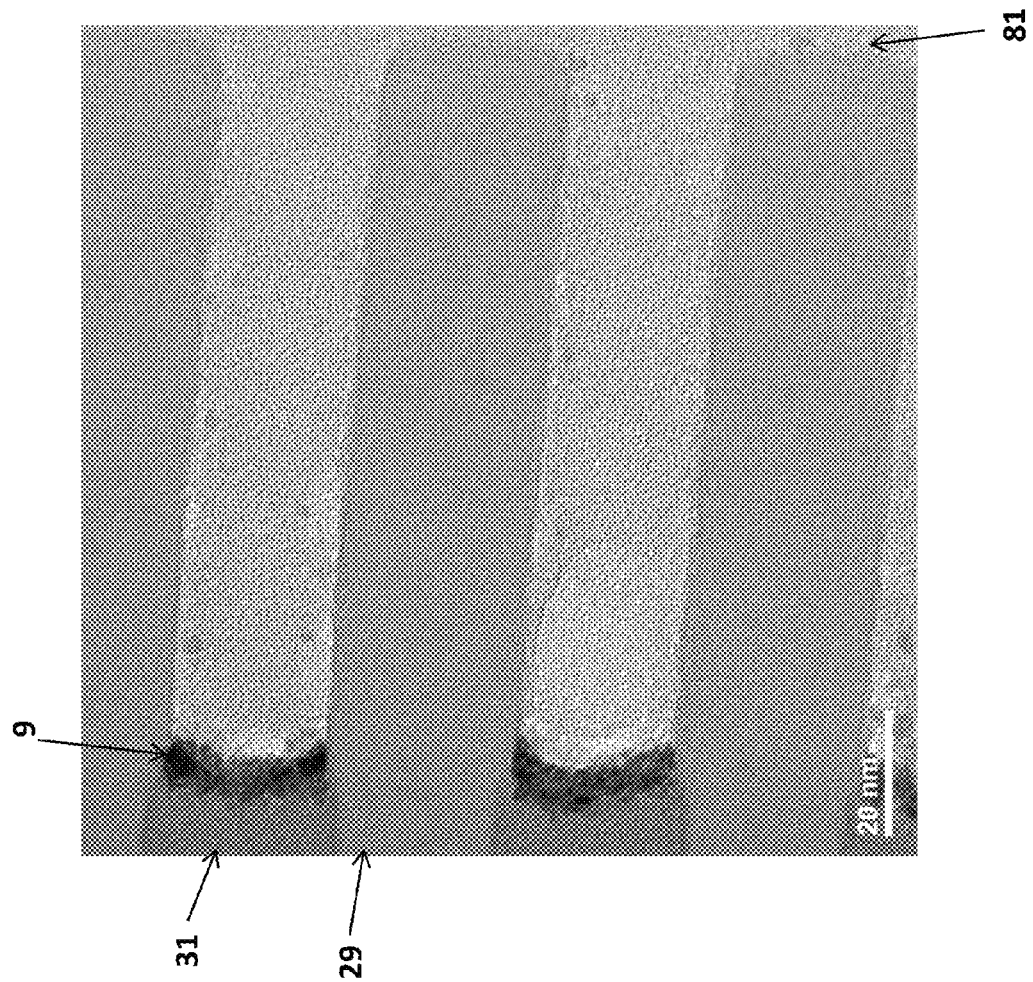
FIGS. 12A and 12B are TEM micrographs illustrating selective conformal coating of a ruthenium floating gate layer on respective recessed and unrecessed silicon nitride layers in an ONON (silicon oxide/silicon nitride) stack according to another embodiment.
Figure 12B:
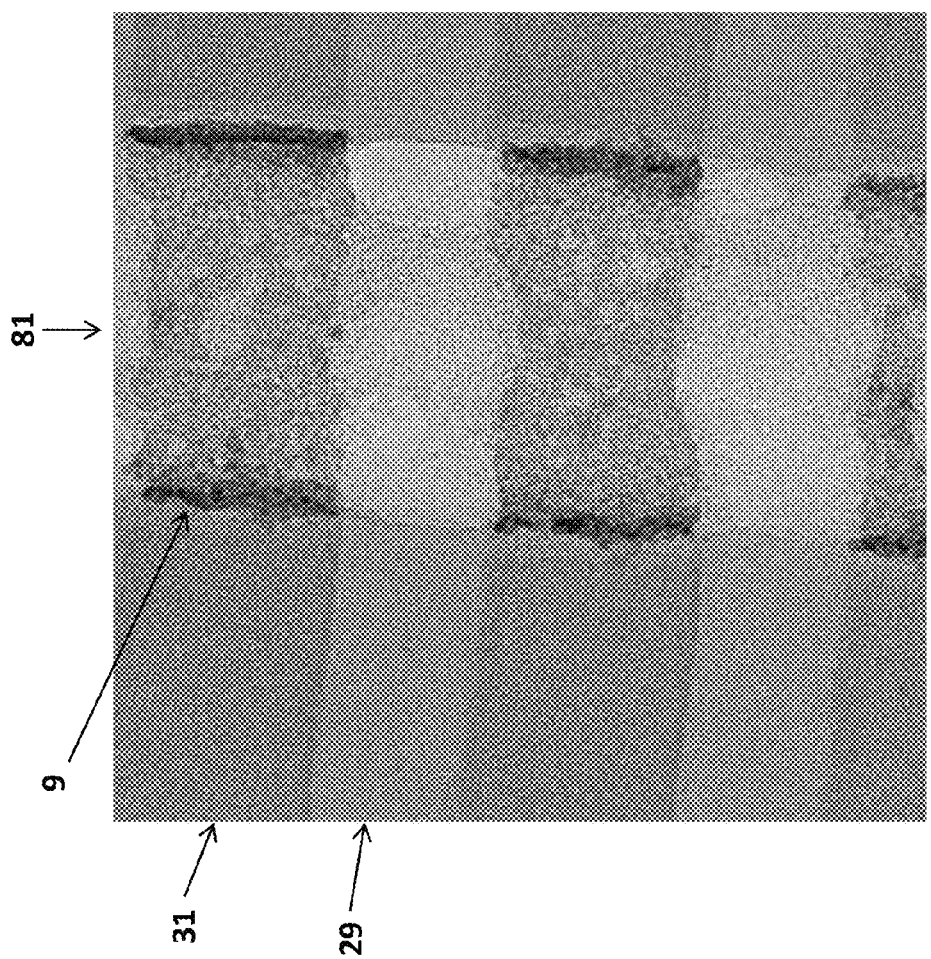

FIGS. 12A and 12B are TEM micrographs illustrating selective conformal coating of a ruthenium floating gate layer 9 on respective recessed and unrecessed edge surfaces of silicon nitride layers 31 in an ONON (silicon oxide 29/silicon nitride 31) stack according to another embodiment. As shown in these Figures, the ruthenium can also be selectively deposited by ALD on the nitride layers 31 compared to the oxide layers 29.

In the embodiments of FIGS. 5-10, the charge storage regions 9 may comprise metal, metal oxide or metal and metal oxide floating gates including Ru, $RuO_2$ or composite $Ru/RuO_2$ continuous strip or nanoparticle floating gates, based on the number of ALD cycles and whether a reducing step is utilized, as described with respect to FIG. 5B above.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of making a monolithic three dimensional NAND string comprising a semiconductor channel and a plurality of control gate electrodes, the method comprising:

forming a stack of alternating first material layers and second material layers over a substrate, wherein the first material comprises an electrically insulating material and the second material is different from the first material;

etching the stack to form a front side opening in the stack;

selectively forming a plurality of discrete charge storage regions using atomic layer deposition, wherein the plurality of discrete charge storage regions comprises at least one of a metal or an electrically conductive metal oxide, and wherein the step of selectively forming the plurality of discrete charge storage regions using atomic layer deposition comprises selectively forming the plurality of discrete charge storage regions using atomic layer deposition on exposed portions of the second material layers in the front side opening but not on exposed portions of the first material layers in the front side opening;

forming a tunnel dielectric over the discrete charge storage regions in the front side opening;

forming the semiconductor channel layer over the tunnel dielectric in the front side opening;

etching the stack to form a back side opening in the stack;

removing at least a portion of the second material layers through the back side opening to form back side recesses between the first material layers;

forming a blocking dielectric in the back side recesses through the back side opening; and forming the plurality of control gate electrodes over the blocking dielectric in the back side recesses through the back side openings;

wherein:
the first material layers comprise silicon oxide layers;
the second material layers comprise silicon nitride layers or polysilicon layers; and
the plurality of discrete charge storage regions comprise ruthenium regions.

2. The method of claim 1, further comprising:
selectively recessing portions of the first material layers in the front side opening after the step of selectively forming the plurality of discrete charge storage regions using atomic layer deposition on exposed portions of the second material layer; and
forming silicon oxide etch stop regions between the discrete charge storage regions and the second material layers which comprise polysilicon layers by selectively oxidizing portions of the polysilicon layers located adjacent to the discrete charge storage regions through the front side opening using a water vapor atmosphere;
wherein removing at least a portion of the second material layers through the back side opening comprises removing the second material layers through the back side opening using the silicon oxide etch stop regions as an etch stop to form the back side recesses between the first material layers.

3. The method of claim 1, wherein:
the second material layers comprise intrinsic polysilicon layers having boron doped polysilicon regions exposed in the front side opening; and
the step of selectively forming the plurality of discrete charge storage regions using atomic layer deposition on exposed portions of the second material layers in the front side opening comprises selectively forming the plurality of discrete charge storage regions using atomic layer deposition on exposed portions of the boron doped polysilicon regions in the front side opening.

4. The method of claim 3, wherein
removing at least a portion of the second material layers through the back side opening comprises removing the intrinsic polysilicon layers through the back side opening using the boron doped polysilicon regions as an etch stop to form the back side recesses between the first material layers.

5. A method of making a monolithic three dimensional NAND string comprising a semiconductor channel and a plurality of control gate electrodes, the method comprising:
forming a stack of alternating first material layers and second material layers over a substrate, wherein the first material comprises an electrically insulating material and the second material is different from the first material;
etching the stack to form a front side opening in the stack;
forming a charge storage dielectric layer in the front side opening prior to forming a tunnel dielectric, such that the tunnel dielectric is located over the charge storage dielectric layer;
forming the tunnel dielectric over discrete charge storage regions in the front side opening;
forming the semiconductor channel layer over the tunnel dielectric in the front side opening;
etching the stack to form a back side opening in the stack;
removing at least a portion of the second material layers through the back side opening to form back side recesses between the first material layers to expose charge storage dielectric layer;
selectively forming a plurality of discrete charge storage regions using atomic layer deposition, wherein the plurality of discrete charge storage regions comprises at least one of a metal or an electrically conductive metal oxide;
forming a blocking dielectric in the back side recesses through the back side opening; and
forming the plurality of control gate electrodes over the blocking dielectric in the back side recesses through the back side openings;
wherein the step of selectively forming the plurality of discrete charge storage regions using atomic layer deposition comprises selectively forming the plurality of discrete charge storage regions using atomic layer deposition on exposed portions of the charge storage dielectric layer in the back side recesses but not on exposed portions of the first material layers in the back side recesses.

6. The method of claim 5, further comprising: forming an etch stop layer;
wherein the charge storage dielectric layer is formed over the etch stop layer in the front side opening prior to forming the tunnel dielectric; and
wherein removing at least the portion of the second material layers through the back side opening to form back side recesses between the first material layers to expose charge storage dielectric layer comprises:
removing the second material layers through the back side opening using the etch stop layer as an etch stop to form the back side recesses between the first material layers; and
removing portions of the etch stop layer exposed in the back side recesses to expose portions of the charge storage dielectric layer in the back side recesses between the first material layers.

7. The method of claim 1, wherein the discrete charge storage regions comprise a metal floating gate.

8. The method of claim 1, wherein the discrete charge storage regions comprise a metal oxide floating gate.

9. The method of claim 1, wherein the discrete charge storage regions comprise a metal and a metal oxide floating gate.

10. The method of claim 1, wherein the plurality of discrete charge storage regions comprises a plurality of ruthenium floating gates.

11. The method of claim 10, wherein selectively forming the plurality of discrete charge storage regions using atomic layer deposition comprises:
(a) using a $RuO_4$ precursor to selectively deposit one or more $RuO_2$ monolayers using atomic layer deposition;
(b) exposing the one or more $RuO_2$ monolayers to a reducing atmosphere to fully or partially reduce the deposited one or more $RuO_2$ monolayers to one or more Ru monolayers; and
(c) repeating steps (a) and (b) a plurality of times to form the plurality of discrete charge storage regions, wherein the plurality of discrete charge storage regions comprise at least one of ruthenium or an electrically conductive ruthenium oxide.

12. The method of claim 10, wherein the atomic layer deposition is performed for more than 25 cycles to form continuous charge storage regions which comprise at least one of ruthenium or $RuO_2$ layer strips.

13. The method of claim 10, wherein the atomic layer deposition is performed for less than 25 cycles to form discrete charge storage regions which comprise at least one of ruthenium or $RuO_2$ nanoparticles.

14. A method of making a monolithic three dimensional NAND string comprising a semiconductor channel and a plurality of control gate electrodes, the method comprising:
forming a stack of alternating first material layers and second material layers over a substrate, wherein the first material comprises an electrically insulating material and the second material is different from the first material;
etching the stack to form a front side opening in the stack;
selectively forming a plurality of discrete charge storage regions using atomic layer deposition, wherein the plurality of discrete charge storage regions comprises at least one of a metal or an electrically conductive metal oxide;
forming a tunnel dielectric over the discrete charge storage regions in the front side opening; and
forming the semiconductor channel layer over the tunnel dielectric in the front side opening;
wherein the plurality of discrete charge storage regions comprises a plurality of ruthenium floating gates; and
wherein selectively forming the plurality of discrete charge storage regions using atomic layer deposition comprises:
(a) using a $RuO_4$ precursor to selectively deposit one or more $RuO_2$ monolayers using atomic layer deposition;
(b) exposing the one or more $RuO_2$ monolayers to a reducing atmosphere to fully or partially reduce the deposited one or more $RuO_2$ monolayers to one or more Ru monolayers; and
(c) repeating steps (a) and (b) a plurality of times to form the plurality of discrete charge storage regions, wherein the plurality of discrete charge storage regions comprise at least one of ruthenium or an electrically conductive ruthenium oxide.

15. The method of claim 14, wherein the atomic layer deposition is performed for more than 25 cycles to form continuous charge storage regions which comprise at least one of ruthenium or $RuO_2$ layer strips.

16. The method of claim 14, wherein the atomic layer deposition is performed for less than 25 cycles to form discrete charge storage regions which comprise at least one of ruthenium or $RuO_2$ nanoparticles.

17. A method of making a monolithic three dimensional NAND string comprising a semiconductor channel and a plurality of control gate electrodes, the method comprising:
forming a stack of alternating first material layers and second material layers over a substrate, wherein the first material comprises an electrically insulating material and the second material is different from the first material;
etching the stack to form a front side opening in the stack;
selectively forming a plurality of discrete charge storage regions using atomic layer deposition, wherein the plurality of discrete charge storage regions comprises at least one of a metal or an electrically conductive metal oxide;
forming a tunnel dielectric over the discrete charge storage regions in the front side opening; and
forming the semiconductor channel layer over the tunnel dielectric in the front side opening;
wherein:
the first material layers comprise silicon oxide layers;
the plurality of discrete charge storage regions comprise ruthenium regions;
the second material layers comprise intrinsic polysilicon layers having boron doped polysilicon regions exposed in the front side opening; and
the step of selectively forming the plurality of discrete charge storage regions using atomic layer deposition comprises either:
(i) selectively forming the plurality of discrete charge storage regions using atomic layer deposition on exposed portions of the the boron doped polysilicon regions in the front side opening but not on exposed portions of the first material layers in the front side opening; or
(ii) selectively forming the plurality of discrete charge storage regions using atomic layer deposition on exposed portions of the boron doped polysilicon regions through a back side opening.

18. The method of claim 17, wherein the step of selectively forming the plurality of discrete charge storage regions using atomic layer deposition comprises selectively forming the plurality of discrete charge storage regions using atomic layer deposition on exposed portions of the the boron doped polysilicon regions in the front side opening but not on exposed portions of the first material layers in the front side opening.

19. The method of claim 17, wherein the step of selectively forming the plurality of discrete charge storage regions using atomic layer deposition comprises selectively forming the plurality of discrete charge storage regions using atomic layer deposition on exposed portions of the boron doped polysilicon regions through the back side opening.

* * * * *